United States Patent
Sudo et al.

(10) Patent No.: US 6,198,685 B1
(45) Date of Patent: Mar. 6, 2001

(54) WORD-LINE DRIVING CIRCUIT AND SEMICONDUCTOR MEMORY DEVICE

(75) Inventors: Naoaki Sudo; Hiroyuki Takahashi; Toshikatsu Jinbo; Kazuo Watanabe; Koji Naganawa; Hironori Nakamura, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/516,742

(22) Filed: Mar. 1, 2000

(30) Foreign Application Priority Data

Mar. 2, 1999 (JP) .................................................. 11-054773

(51) Int. Cl.[7] ...................................................... G11C 8/00
(52) U.S. Cl. ................ 365/230.06; 365/230.03; 365/230.08
(58) Field of Search .................. 365/230.06, 230.03, 365/191, 230.08, 233.5

(56) References Cited

U.S. PATENT DOCUMENTS 6,067,257 * 5/2000 Kitsukawa et al. ............. 365/189.11
6,118,697 * 9/2000 Tanzawa et al. ................ 365/185.11

FOREIGN PATENT DOCUMENTS 9-17189    1/1997  (JP) .

* cited by examiner

Primary Examiner—David Nelms
Assistant Examiner—Thong Le
(74) Attorney, Agent, or Firm—Young & Thompson

(57) ABSTRACT

There is provided a word-line driving circuit has: two P-channel type transistors which are connected in a flip-flop configuration and one of which is connected between a first power supply and a word line; an N-channel transistor which is connected between a signal obtained by decoding a low-order address and a gate of the above-mentioned one P-channel type transistor and which has its gate connected with a signal obtained by decoding a high-order address; a first NN-channel type transistor which is connected between a word line and a second power supply and which has its gate connected with the signal obtained by decoding a low-order address; and a second NN-channel type transistor which is connected between a word line and the second power supply and which has its gate connected with the signal obtained by decoding a high-order address.

12 Claims, 16 Drawing Sheets

FIG.3

| operation conductions | word-line driving voltage | selecting BXMi signal | un-selecting BXMi signal | selecting BXSi signal | un-selecting BXSi signal |
|---|---|---|---|---|---|
| read out | Vread (5.0V) | L | H | L | H |
| write in | Vprog (10.0V) | L | H | L | H |
| erasure | Veras (-10.0V) | All"L" (in selected sector) | — | All"L" (in selected sector) | — |

WORD-LINE DRIVING CIRCUIT AND SEMICONDUCTOR MEMORY DEVICE

BACKGROUND OF THE INVENTION

1. Field of the Invention

The present invention relates to a word-line driving circuit and a semiconductor memory device, and more particularly to the word-line driving circuit for the semiconductor memory device which needs a high voltage for read/write operations.

2. Description of the Related Art

In a semiconductor memory device, for a plurality of memory elements arranged in a bit-line direction for each block, a word-line driving circuit is provided for each of word lines in the block, so that the circuit may be selected in response to addressing, to drive the corresponding word line for performing write-in, read-out, and erasure operations to a corresponding memory cell.

FIG. 16 exemplifies a conventional word-line driving circuit, which is shown to comprise: P-channel type transistors 101 and 102 which constitute a flip-flop configuration switching circuit; N-channel transistors 103 and 104 which each act as a switch; a NOR circuit 105 which performs logical operations on a signal obtained by decoding high-order addresses and a signal obtained by decoding low-order addresses; and an inverter 106 which inverts an output signal of the NOR circuit 105.

In the conventional word-line driving circuit shown in FIG. 16, when both a high-order select signal BXMi for specifying high-order addresses in a memory-cell array and a low-order select signal BXSi are of a high level, the NOR circuit 105 provides a high-level output, which turns on the N-channel type transistor 103 and off the N-channel type transistor 104, which in turn turns on the P-channel type transistor 102, thus supplying a word line Wi with a power-supply voltage Vcc or a step-up voltage Vpp. When, on the other hand, either one or both of the high-order select signal BXMi and the low-order select signal BXSi are of a high level, the NOR circuit 105 provides a low-level output, which turns off the N-channel type transistor 103 and on the N-channel type transistor 104, thus disconnecting the word line Wi from the VCC/Vpp to reset it to a ground level (GND).

A circuit configuration similar to the above-mentioned word-line driving circuit is disclosed in for example Japanese Laid-Open Patent Application No. Hei9-17189.

The word-line driving circuit shown in FIG. 16, however, each requires a total of 10 transistors: two P-channel type transistors, two N-channel type transistors, four transistors in the NOR circuit, and two transistors in the inverter.

The above-mentioned semiconductor memory device requires one word-line driving circuit for each word line, a total of which circuit numbers a tremendous value with a recent-year semiconductor mass-storage device of an ever increasing integration density, so that when the above-mentioned word-line driving circuit requiring many transistors is employed, the circuitry size increases too much, thus adding to a chip size of a semiconductor IC to which a memory device is contained.

With an increasing degree of fine patterning also, memory elements which constitute a memory device is decreased in size, corresponding to which inter-word-line spacing is reduced, so that if such a small spacing between the word lines is employed in layout of a word-line driving circuit, that circuit has a poor layout efficiency of being long laterally, thus leading to a problem of a larger chip size.

SUMMARY OF THE INVENTION

In view of the above, it is an object of the present invention to provide a word-line driving circuit that can reduce the number of transistors which constitute a unit circuit, thus compacting a chip size of even a large scale semiconductor integrated circuit.

Also, it is an another object of the present invention to provide a semiconductor memory device having such a word-line driving circuit.

According to a first aspect of the present invention, there is provided a word-line driving circuit provided for each corresponding word line for selecting the predetermined word line with a low-order address signal from among a plurality of word lines divided into a plurality of blocks one of which is selected by a high-order address signal, the word-line driving circuit including:

a first P-channel type transistor connected between a first power supply for supplying a predetermined potential to selected word lines and a word line;

a second P-channel type transistor connected with the first P-channel type transistor in a flip-flop configuration;

a first N-channel type transistor which is connected between a first signal line for supplying a signal obtained by decoding a low-order address and a gate of the first P-channel type transistor and a gate of which is connected with a second signal line for supplying a signal obtained by decoding a high-order address;

a second N-channel type transistor which is connected between a second power supply for securing a potential of an unselected word line and the word line and a gate of which is connected with the first signal line; and a third N-channel type transistor which is connected between the word line and the second power supply and a gate of which is connected with the second signal line.

In the foregoing, a preferable mode is one wherein the second power supply supplies a word line with a negative potential at a time of an erasure operation.

Also, a preferable mode is one wherein the second N-channel type transistor and the third N-channel type transistor both of which are connected to the second power supply are designed so as to be operative even when supplied with a negative potential.

Also, a preferable mode is one wherein the third N-channel type transistor is shared in use by two word-line driving circuits adjacent each other in the block and connected between word lines in the two word-line driving circuits and also a back gate of the third N-channel type transistor is connected with the second power supply.

Also, a preferable mode is one wherein the third N-channel type transistor is shared in use by two word-line driving circuit not adjacent to each other in the block and connected between the two word-line driving circuits and a back gate of the third N-channel type transistor is connected with the second power supply.

Also, a preferable mode is one wherein, when switching the word line from an unselected state to a selected state, the first power supply supplies a current to the word line in such a manner as to increase a potential of the word line up to a power-supply voltage, in response to switch-over of a signal obtained by decoding the low-order address signal; and the first power supply is configured to supply a current to the word line in such a manner as to increase a potential of the word line to a step-up voltage higher than the power-supply voltage by a predetermined lapse of time elapses after completion of switch-over of the signal obtained by decoding the low-order address signal.

Also, a preferable mode is one wherein the predetermined lapse of time is a time lapse taken by the word line to reach a predetermined voltage after switch-over of the signal obtained by decoding the low-order address signal.

Also, a preferable mode is one wherein the predetermined voltage is 0.9 Vcc, where Vcc is a power-supply voltage.

Also, a preferable mode is one wherein the signal obtained by decoding the low-order address signal has been pulsed in response to a pulse signal which detected switch-over in an address signal for selecting a word line.

Furthermore, a preferable mode is one wherein the pulse signal is terminated in a predetermined lapse of time after detection of switch-over in an address signal for selecting a word line and, in a predetermined lapse of time after starting of the pulse signal, the first power supply supplies a step-up voltage higher than a power-supply voltage.

In a configuration of the above aspect, word lines are divided into a plurality of blocks so that from a block selected by high-order address signals, a predetermined word line may be selected by low-order address signals; with this, a word-line driving circuit comprises: two P-channel type transistors connected in a flip-flop configuration; a switching circuit in which one of the above-mentioned two P-channel transistors is connected between a selected word line and a first power supply for supplying a predetermined potential to that word line; a first N-channel type which is connected between a first signal line for supplying a signal obtained by decoding low-order address signals and a gate of the above-mentioned one P-channel type transistor and also which has its gate connected with a second signal line for supplying a signal obtained by decoding high-order address signals; a second N-channel type transistor which is connected between a word line and a second power supply for guaranteeing a potential of word lines not selected at the time of read-out and also which has its gate connected with the first signal line; and a third N-channel type transistor which is connected between a word line and the above-mentioned second power supply and also which has its gate connected with the second signal line.

When driving memory elements connected to a word line, a signal obtained by decoding the above-mentioned high-order address signals and a signal obtained by decoding the above-mentioned low-order address signals for selecting the word line are both set to a first state 1, to turn on the above-mentioned one P-channel type transistor through the above-mentioned N-channel type transistor, thus supplying a drive voltage to that word line from the above-mentioned first power supply. When resetting the memory elements, on the other hand, a signal obtained by decoding low-order address signals for selecting a word line is set to a second state, to supply a reset voltage to the word line through the above-mentioned second N-channel type transistor from the above-mentioned second power supply; when resetting all the memory elements in the above-mentioned block, a signal obtained by decoding the above-mentioned high-order address signals is set to the second state, to supply the reset voltage to that word line through the above-mentioned third N-channel type transistor from the above-mentioned second power supply. When erasing data stored in all the memory elements in the above-mentioned block, a signal obtained by decoding the above-mentioned high-order address signals and a signal obtained by decoding the low-order address signals for selecting all the word lines in this block are both set to the first state, to supply a negative erasure voltage to every word line from the above-mentioned second power supply through the above-mentioned second and third N-channel type transistors.

Also, according to a second aspect of the present invention, there is provided a semiconductor memory device having a plurality of word-line driving circuits according to the first aspect, the semiconductor memory including:

a decoder for driving a word line connected to each memory cell in each of a plurality of blocks, the memory cell being capable of electrical write-in and erasure and arranged in an array divided into the plurality of blocks, wherein the decoder is constituted by the plurality of word-line driving circuits;

means for selecting the decoder by use of a select signal corresponding to a high-order address of a word line;

means for selecting one of a plurality of word-line driving circuits in the selected decoder, by use of a plurality of low-order pre-decode signals corresponding to a low-order of a word line in the selected decoder; and means for driving a word line connected to the selected word-line driving circuit.

Also, according to a third aspect of the present, there is provided a word-line driving circuit including:

means for holding and outputting a first input;

means for initializing a word line from a first state when a first pre-decode input is in an unselected state;

means for initializing a word line from a first state when a second pre-decode input is in an unselected state; and means for putting a word line into a first state by causing the means for holding and outputting a first input to output the first input to the word line, when the first pre-pre-decode input and the second pre-decode input are both in a selected state.

Therefore, the word-line driving circuit according to the above aspects can be constituted by a smaller number of component transistors than a conventional word-line driving circuit. Moreover, that number of transistors can be reduced further by arranging a word-line resetting transistor between arbitrary two word lines in a block. Also, by pulsing the pre-decode signal for selecting the word-line driving circuit, it is possible to reduce the size, without decreasing the word-line driving speed, of the component first P-channel type transistor (P-channel type transistor 22) connected between the first power supply for supplying a predetermined potential to selected word lines and the corresponding word line and the third N-channel type transistor (e.g., NN-channel type transistor 25A) connected between the corresponding two word lines in the block and which has its back gate connected with the second power supply for securing a potential of unselected word lines.

BRIEF DESCRIPTION OF THE DRAWINGS

The above and other objects, advantages and features of the present invention will be more apparent from the following description taken in conjunction with the accompanying drawings in which:

FIG. 3 is a table indicating operation conditions for the word-line driving circuit according to the same embodiment;

DESCRIPTION OF THE PREFERRED EMBODIMENTS

The following will describe embodiments of the present invention with reference to the drawings. The description is specifically made using the embodiments.

First Embodiment

Figure 1:
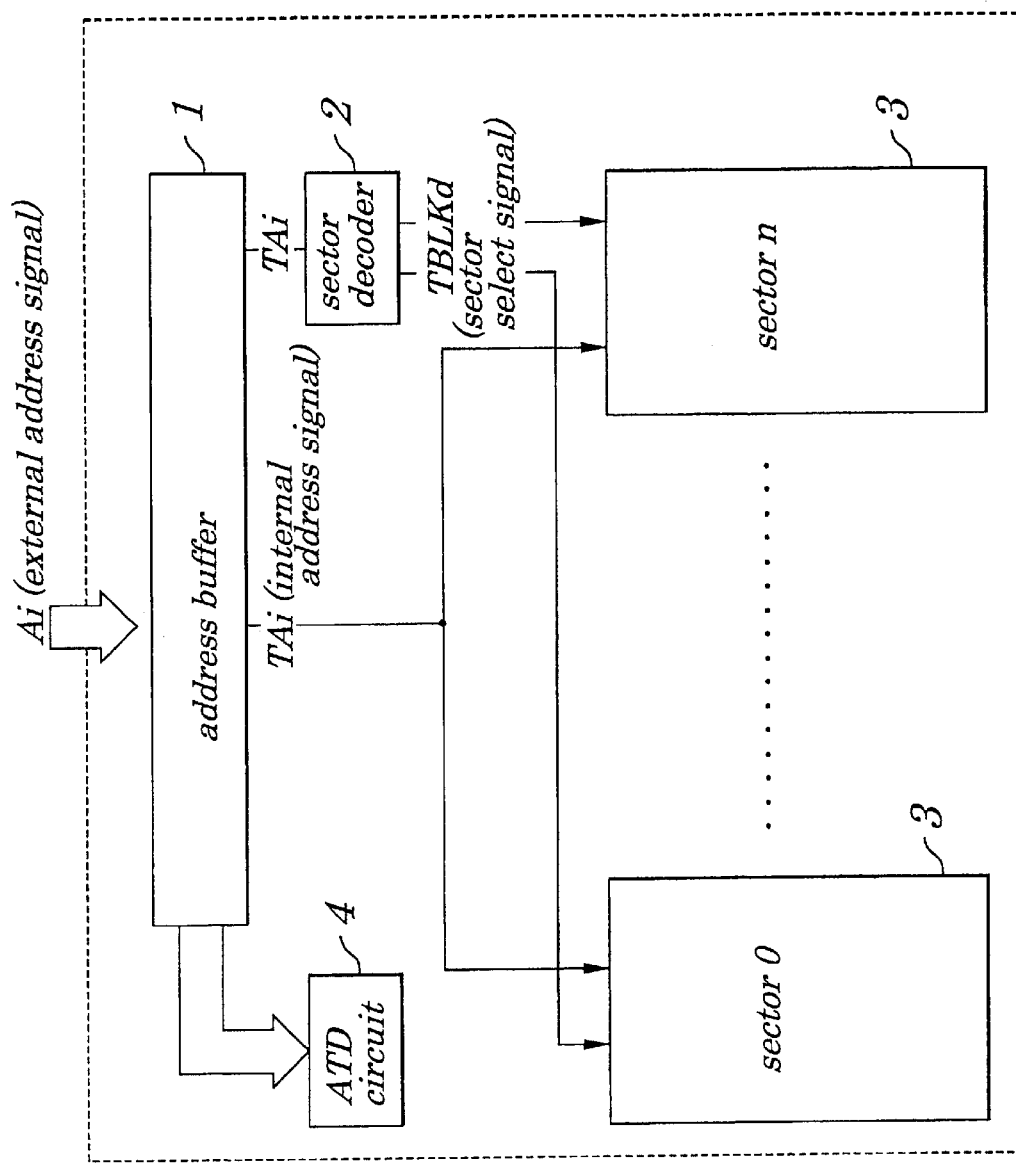
FIG. 1 is a block diagram showing an overall configuration of a semiconductor memory device chip to which is applied a word-line driving circuit according to a first embodiment of the present invention.

As shown in FIG. 1, a semiconductor memory device according to the first embodiment roughly comprises: an address buffer 1; a sector decoder 2; a plurality of sectors 3 (sectors 0–n); and an address transition detection (ATD) circuit 4.

The address buffer 1 generates the internal address signal TAi from the external address signals Ai and distributes it to various portions. The sector decoder 2 decodes the internal address signal TAi to generate a sector select signal TBLKd (d=0–n) for selecting each of the sectors 3. Each of the sector 3 comprises: memory cells corresponding to combinations of a plurality of bit lines and a plurality of word lines; and peripheral circuits for driving the bit lines and the word lines. The ATD circuit 4 controls read/write operations of memory cells in a selected sector in response to a change in the state of address signals input at the address buffer 1.

In a semiconductor memory device comprised of an 8 M-bit flash memory, for example, includes 16 sectors 3 (sectors 0–15) each having a 0.5 M-bit memory capacity, which are selected operative one at a time by one of the sector select signals TBLK0 through TBLK15 sent from the sector decoder 2.

Figure 2:
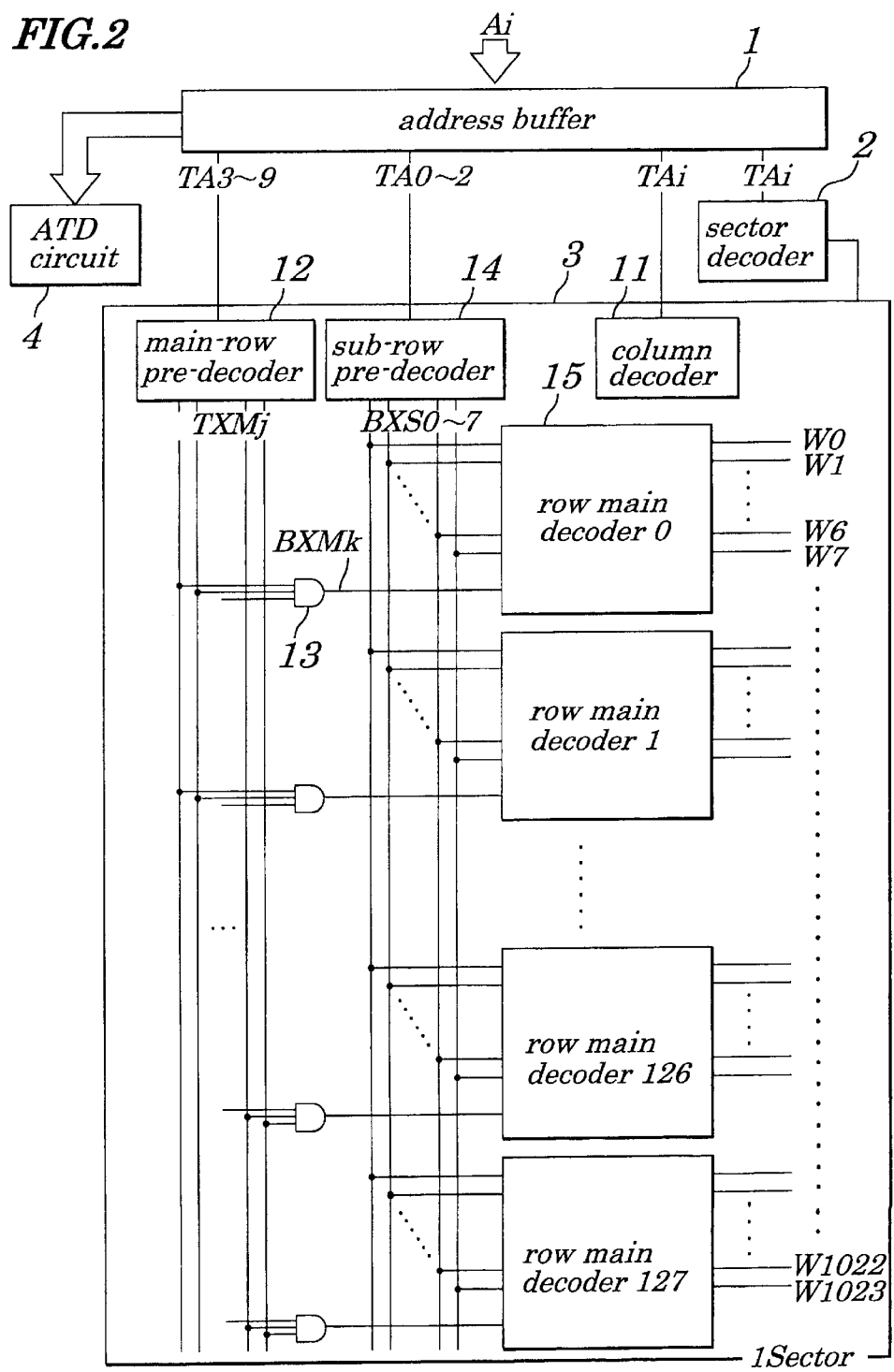
FIG. 2 is a block diagram showing an address-system configuration of the semiconductor memory device to which is applied the word-line driving circuit according to the same embodiment.

As shown in FIG. 2, each sector 3 in this embodiment roughly comprises: a column decoder 11; a main-row pre-decoder 12; a plurality of AND circuits 13; a sub-row pre-decoder 14; and a plurality of row main-decoder 15 (row main-decoders 0–127).

The column decoder 11 decodes a plurality of internal address signal TAi to select one of a plurality of bit lines and drive it. The main-row pre-decoder 12 decodes high-order bit signals TA3–TA9 for internal addresses, to generate a high-order pre-decode signal TXMj. The plurality of AND circuits 13 perform a logical product of the high-order pre-decode signal TXMj, to output a main-decoder select signal BXMk to each row main decoder 15. The sub-row pre-decoder 14 decodes low-order bit signals TA0–TA2 for internal addresses, to generate low-order pre-decode signal BXS0-BXS7 and supply them to the row main decoder 15. The row main decoder 15, when selected by the main decoder select signal BXMk, enters such a state as to drive either one of a plurality of word lines corresponding to the low-order pre-decode signal BXS0–BXS7.

When, for example, a sector 3 has a 0.5M-bit capacity, a column decoder 11 selects one of 512 bit lines and drives it. The main-row pre-decoder 12 decodes high-order bit signals TA3–TA9 for X addresses, to output a plurality of high-order pre-decode signals TXMjs (j=0–6) in parallel and each AND circuit, on the other hand, decodes the high-order pre-decode signal TXMj, to output to the corresponding row main decoders 15 the main decoder select signals BXMks (k=0–127) only one of which goes low in level, thus selecting either one of these row main decoders 15. The sub-row pre-decoder 14 decodes low-order three-bit signals TA0–TA2 for X addresses, to output in parallel a plurality of low-order pre-decode signals BXS0–BXS7 only one of which goes low in level, to low-order pre-decode signals BXS0–BXS7. The row main decoder 15, when selected by the main decoder select signal BXMk, enters such a state as to supply a drive signal to selected either one of eight word lines, for example W0–W7, corresponding to the low-order pre-decode signals BXS0–BXS7.

Thus, the column decoder 11 selects either one of the 512 bit lines, and the main-row pre-decoder 12 and the sub-row pre-decoder 13, on the other hand, select in cooperation either one of the 1024 word lines W0–W1023, thus putting into a driven state a memory cell at an intersection of thus selected bit line and word line.

The ATD circuit 4 detects a change in the state of an address input at an address buffer 1, to control read/write operations to memory cells in a selected sector.

Figure 4:
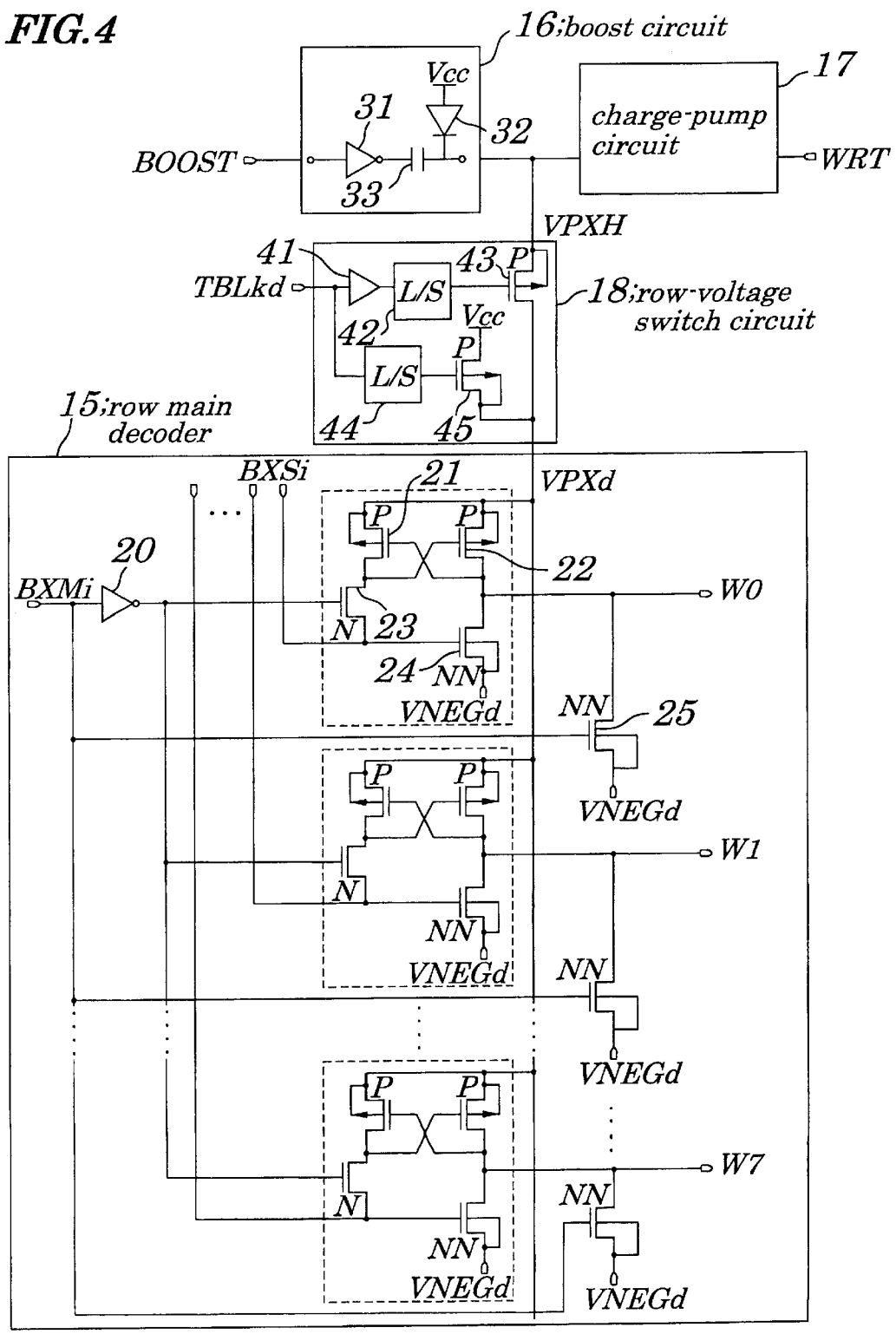
FIG. 4 is a circuit diagram of a configuration of a word-line driving system according to the same embodiment.

With reference to FIGS. 3 and 4, now the following will explain the state of various signals when the word-line driving circuit in this embodiment is operated in various conditions.

At the time of a read-out operation, both the main decoder select signal BXMi and the low-order pre-decode signal BXSi are low in level for a selected word-line driving circuit, thus supplying a voltage of for example 5.0V as a word-line drive voltage Vread for read-out from a power supply VPXd to a selected word line.

At the time of a write-in operation, both the main decoder select signal BXMi and the low-order pre-decode signal BXSi are low in level for a selected word-line driving circuit, thus supplying a voltage of for example 10.0V as a word-line drive voltage Vprog from the power supply VPXd to a selected word line.

When not selected, the word line is reset to the grounding (GND) level, because at the times of both read-out and write-in operations, either one of the main decoder select signal BXMi and the low-order pre-decode signal BXSi is high in level.

At the time of an erasure operation, both the main decoder select signal BXMi and the low-order pre-decode signal BXSi are low in level for all the word-line driving circuits in a selected sector, thus supplying a voltage of for example −10.0V as an erasure voltage Veras from a power supply VNEGd to a selected word line. The power supply VPXd in this case is set at the GND level.

As shown in FIG. 4, the word-line drive system in this embodiment roughly comprises: a row main decoder 15; a boost circuit 16; a charge-pump circuit 17; and a row-voltage switch circuit 18.

The boost circuit 16 has an inverter 31, a diode 32, and a capacitor 33, to usually output a power-supply voltage (e.g., 3.0V) via the diode 32 to a power-supply line VPXH. At the time of read-out, the boost circuit 16 is given a low-level boost voltage BOOST, to invert it at the inverter 31 and then superimpose it on the power-supply voltage Vcc, thus outputting a step-up voltage Vread to the power-supply line VPXH.

The charge-pump circuit 17, at the time of write-in on the other hand, outputs a step-up voltage Vprog to the power-supply line VPXH, corresponding to an input level of a write-in power-supply control signal WRT.

The row-voltage switch circuit 18 has an inverter 41, a level-shift circuit (L/S) 42, a P-channel type transistor 43, a level-shift circuit (L/S) 44, and a P-channel type transistor 45. The P-channel type transistor 43 has its back gate connected to its source, while the P-channel type transistor 45 has its back gate connected to its drain.

At the time of selecting a sector, the incoming sector select signal TBLKd is set at the Vcc level, to be inverted at the inverter 41 and level-shifted at the level shift circuit 42 in order to output the ground (GND) level, thus turning ON the P-channel type transistor 43, which in turn causes the power-supply voltage VPXH to be fed to the power-supply line VPXd, at the same time as which the sector select signal TBLKd is level-shifted at the level shift circuit 44 to output the VPXH level, thus turning OFF the P-channel type transistor 45.

At the time of selecting no sectors, on the other hand, the sector select signal TBLKd is set to the GND level, to be level-shifted at the level shift circuit 44 in order to supply the GND level to the P-channel type transistor 45 and turn it ON, thus outputting the power-supply voltage Vcc to the power-supply line VPXd, at the same time as which the sector select signal TBLKd passes through the inverter 41 and the level shift circuit 42, to be output as a voltage corresponding to the power-supply voltage VPXH, thus turning OFF the P-channel type transistor 43.

The row main decoder 15 comprises: an inverter 20; a plurality of word lines W0, W1, . . . , and corresponding word-line driving circuits, each of which comprises a P-channel type transistors 21 and 22; an N-channel type transistor 23; and NN-channel type transistor 24 and 25. The P-channel type transistors 21 and 22 have each their back gates connected to their source. The NN-channel type transistors 24 and 25 are negative-voltage-application N-channel type transistors of a triple-well structure and have each their back gate connected to their source.

In the row main decoder 15, the inverter 20 is connected between the main decoder select signal BXMi and the gate of the N-channel type transistor 23. The P-channel type transistors 21 and 22 both have their source connected to the power supply VPXd and have their gate connected to the drain of the mating transistor of each other, thus constituting a flip-flop-structured switch circuit. The N-channel type transistor 23 has its drain connected to the drain of the P-channel type transistor 21 and has its source connected to a signal line for supplying the low-order pre-decode signal BXSi and also has its gate connected to a signal line for supplying via the inverter 20 the main decoder select signal BXMi, thus constituting a switch circuit turned ON and OFF according to the select signal BXMi. The NN-channel type transistor 24 has its drain connected to the drain of the P-channel type transistor 22 and a word line and has its source connected to the power supply VNEGd and also has its gate connected to a signal line for supplying the low-order pre-decode signal BXSi, thus constituting a switch circuit turned ON and OFF corresponding to the select signal BXSi. The NN-channel type transistor 25 has its drain connected to a word line and has its source connected to the power supply VNEGd and also has its gate connected to a signal line for supplying the main decoder select signal BXMi, thus constituting a switch circuit turned ON and OFF corresponding to the select signal BXMi.

At the time of a read/write operation, the main decoder select signal BXMi is set to low in level, to select row main decoders of one of unitary eight blocks and, at the same time, the low-order pre-decode signal BXSi is set to low in level, to select one of the word-line driving circuits. In this case, the N-channel type transistor 23 of the selected block is turned ON and, at the same time, the low level of the select signal BXSi of thus selected word-line driving circuit is sent through the N-channel type transistor 23 to the gate of the P-channel type transistor 22 to turn it ON, to connect the power supply VPXd to for example a word line W0, thus supplying the read-out voltage Vread or the write-in voltage Vprog to memory cells connected to the word line W0.

For word lines not selected, on the other hand, the low-order pre-decode signal BXSi is set to a high level, to send a high level of the select signal BXSi through the N-channel type transistor 23 to the gate of the P-channel type transistor 22 to turn it ON, thus connecting the power supply VPXd to none of these word lines. At this point in time, the NN-channel type transistor 24 is turned ON, to connect for example the word line W0 to the power supply VNEGd. The VNEGd is usually set at the GND level, so that all the memory cells connected to the word line W0 are reset to the GND level.

When the main decoder select signal BXMi is high in level, on the other hand, the N-channel type transistors 23 of all the row main decoders IS in one block are turned OFF, to turn OFF the P-channel type transistor 22 irrespective of the level of the low-order pre-decode signal BXMi, thus connecting the power supply VPXd to none of the word lines. In each row main decoder 15, on the other hand, the NN-channel type transistor 25 is turned ON, to connect its respective word line to the power supply VNEGd. The VNEGd is usually set at the GND level, so that all the memory cells connected to the word lines in that block are reset to the GND level.

At the time of an erasure operation, for all the row main decoders IS in a selected sector, both the main decoder select signal BXMi and the low-order pre-decode signal BXMi are set to a low level and the power supply VPXd is set to the GND level by a power-supply circuit (not shown) in the row-voltage switch circuit 18 and also the power supply VNEGd is set to the erasure voltage Veras, for example −10V, to turn OFF the P-channel type transistor 22 in order to break the power supply VPXd and turn ON the NN-channel type transistors 24 and 25, thus connecting the power supply VNEGd to each word line. The contents of memory cells connected to these word lines are erased because they are connected to the power supply VNEGd which is set to the erasure voltage Veras.

Figure 5:
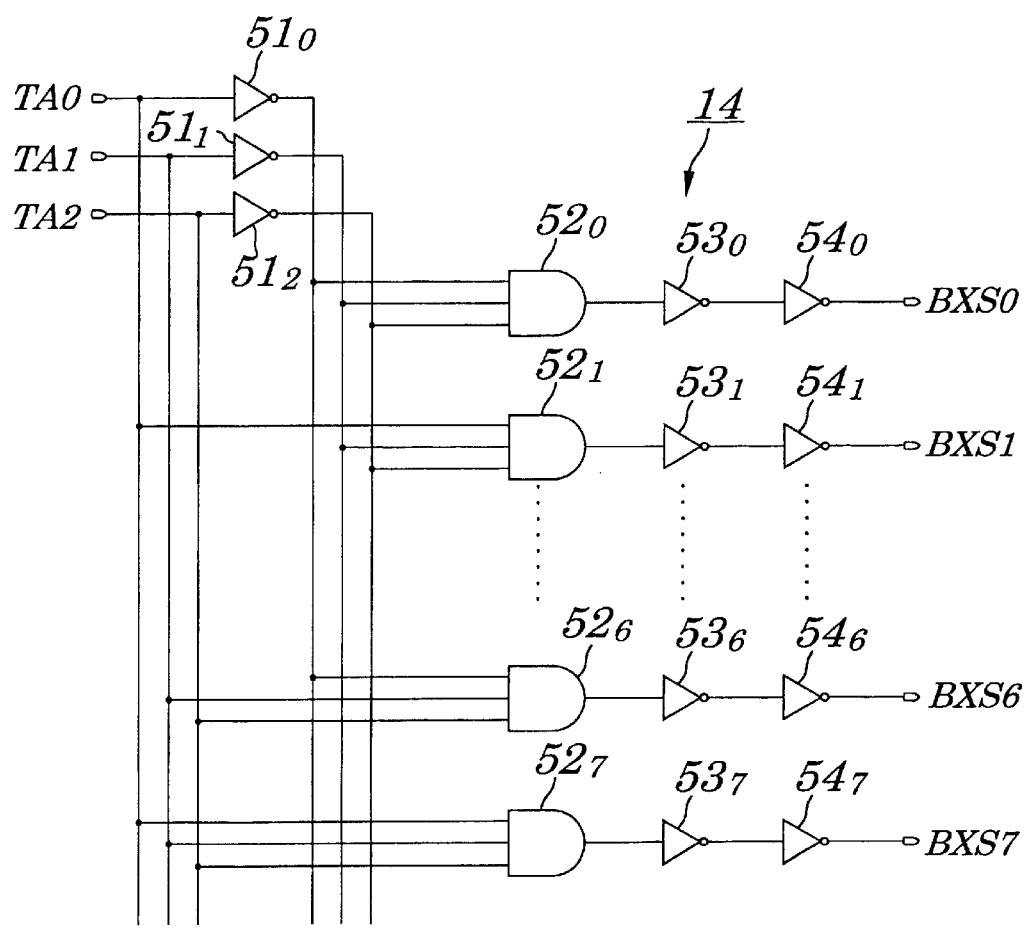
FIG. 5 is a circuit diagram showing a configuration of a sub-row pre-decoder which corresponds to the word-line driving circuit according to the same embodiment.

The sub-row pre-decoder 14 in this embodiment, as shown in FIG. 5, comprises; inverters $51_0$, $51_1$, and $51_2$; NAND circuits $52_0$, $52_1$, ..., $52_6$, and $52_7$; inverters $53_0$, $53_1$, ..., $53_6$ and $53_7$; and inverters $54_0$, $54_1$, ..., $54_6$, and $54_7$. The inverters $51_0$, $51_1$, and $51_2$ generate outputs obtained after inverting levels of the internal address signals TA0, TA1, and TA2 respectively. The NAND circuits $52_0$, $52_1$, ..., $52_6$, and $52_7$ receive combinations of three of a total of six signals of the three internal address signals TA0, TA1, and TA2 and their another three inverted signals, to generate output signals respectively. The inverters $53_0$, $53_1$, ..., $53_6$, and $53_7$ invert outputs of the NAND circuits $52_0$, $52_1$, ..., $52_6$, and $52_7$ respectively and the inverters $54_0$, $54_1$, ..., $54_6$, and $54_7$ invert outputs of the inverts outputs of the inverters $53_0$, $53_1$, ..., $53_6$, and $53_7$, to output the low-order pre-decode signals BXS0, BXS1, ..., BXS6, and BXS7.

Figure 6:
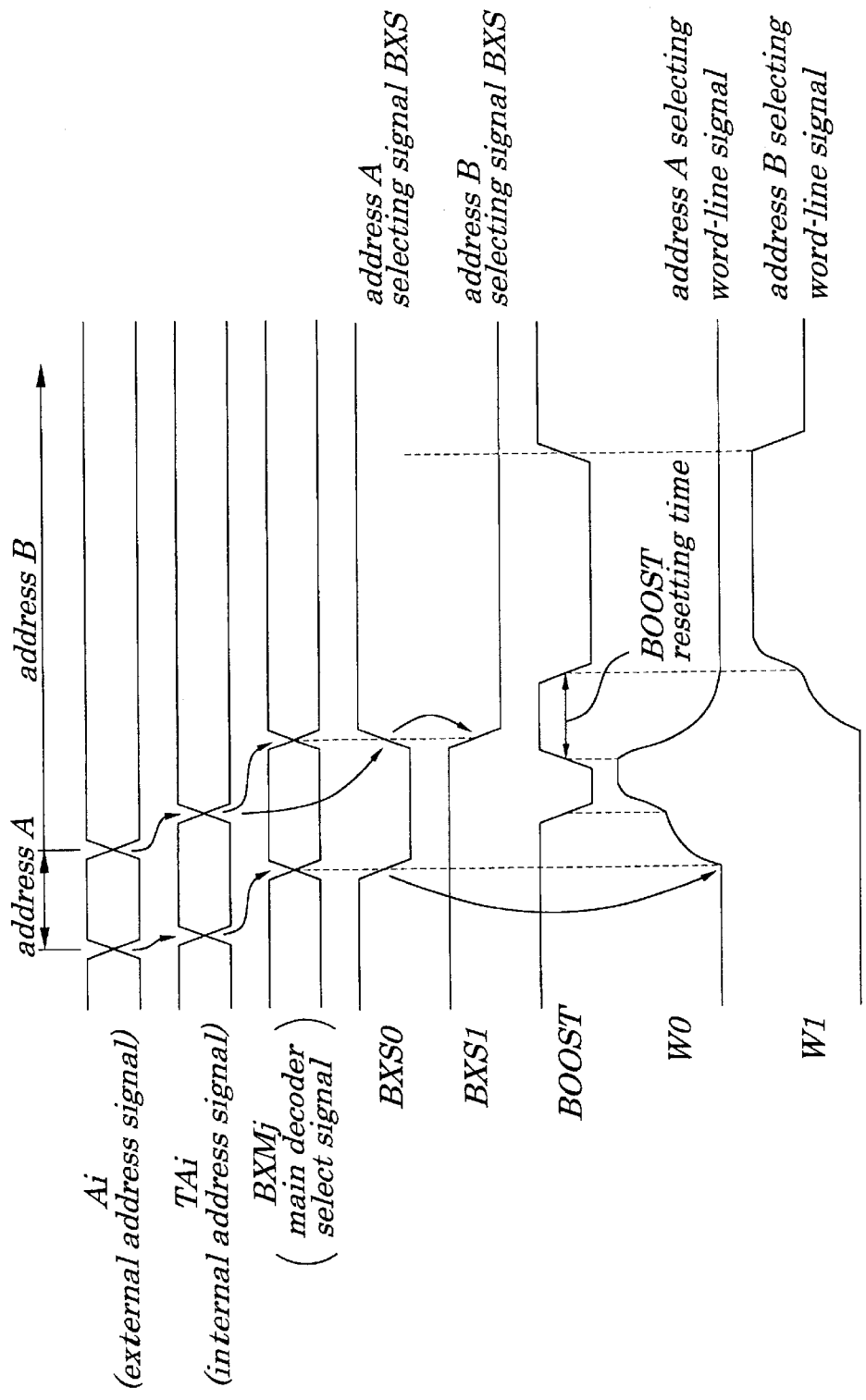
FIG. 6 is a timing chart explaining operations of the word-line driving circuit according to the same embodiment.

With reference to FIG. 6, the following will describe in detail the read-out operation of the word-line driving circuit in this embodiment.

When the external address Ai is given to select a word line, the corresponding internal address TAi output from the address buffer 1 causes the sector decoder 2 to output the sector select signal TBLKd, thus selecting a sector shown in FIG. 2. Also, it is supposed here that based on the internal addresses TAi, a certain bit line shown in FIG. 4 has been selected by the column decoder 11 in that sector. At this point in time, the P-channel type transistor 43 has been turned ON by the row-voltage switch circuit 18 corresponding to the sector select signal TBLKd, thus making the power-supply voltage VPXH from the boost circuit 16 ready for being output to the power supply VPXd.

It is here supposed that the external addresses Ai changes as addresses A and B in this order and the internal address TAi changes correspondingly, to set the main decoder select signal BXMj and, at the same time, change the low-order pre-decode signals to a low level sequentially in such a manner that the select signal BXS corresponding to the address A may change to BXS0 and the select signal BXS corresponding to the address B may change to BXS1.

When the low-order pre-decode signal BXS0 is thus set to a low level, a word-line driving circuit corresponding to the word line W0 selected by the address A outputs the power supply voltage VPXd to the word line W0. In this case, a boot signal BOOST applied to the boost circuit 16 is controlled in such a manner as to go low in level with a predetermined delay with respect to a change in the main decoder select signal and the low-order pre-decode signal, so that the boost circuit 16 is not activated initially, to output Vcc level to the power supply VPXd. With this, a potential of the word line W0 rises according to its charge-up properties determined by its load capacitance, to a level near Vcc (e.g., 0.9 Vcc). Next, in a predetermined lapse of time, the boost signal BOOST goes low in level, to change the power supply voltage VPXd to a step-up voltage, i.e. a voltage Vread at the time of read-out, thus causing the word line W0 to rise again according to its charge-up properties up to Vread, where a read-out operation is performed.

Next, when the external address Ai changes to the address B, correspondingly, the low-order pre-decode signal BXS0 returns to a high level and, at the same time, the low-order pre-decode signal BXS1 goes low in level. With this, a potential of a word line W1 selected by the address B rises, like in the case of the word line W0, according to certain charge-up properties to a level near Vcc and, when the boost signal BOOST then goes low in level, further rises according to the charge-up properties to Vread, where a read-out operation is performed.

In this case, the boost signal BOOST changes in such a manner that when the external address changes to the address A, the BOOST signal may go low in level and be held low for a lapse of time required to complete a read-out operation at a selected word line and then may return to a high level and be held high for a predetermined lapse of time. Next, when the external address changes from the address A to the address B, the BOOST signal goes again low in level. In this case, the boost signal BOOST is held high for a boost-reset time, which is adjusted to match a time required to change the word line charged up to the read-out voltage Vread to a reset state of the GND level.

In this case, to reset word lines not selected, the NN-channel type transistors 24 and 25 must each have an enhanced current-supply capacity in order to guarantee a predetermined reset speed. That is, they must have a larger size.

Also, when a word line is selected and the P-channel type transistor 22 outputs the power-supply voltage Vcc and the step-up voltage (Vread) to the word line, after a potential of the selected word line is set securely to a Vcc level (e.g., 0.9 Vcc), the boost circuit 16 is activated to output the step-up voltage, so that the P-channel type transistor 22 must have an enhanced current-supply capacity so that the potential of the word line can be changed to the power-supply voltage Vcc rapidly. That is, they must have a large size.

As mentioned above, the boost circuit 16 is delayed in activation for the following two reasons.

Fist, when a word line is changed from an unselected state to a selected state or vice versa in response to switch-over in addressing, such a transient state occurs that the P-channel type transistor 22 and the NN-channel type transistor 24 are turned ON simultaneously, so that if the boost circuit 16 is activated initially, the step-up voltage is short-circuited to GND, to discharge an electricity stored in the capacitor 33 of the boost circuit 16, thus making it impossible to drive the word line with the step-up voltage. During such a transition state, a through current flows in the P-channel type transistor 22 from the power-supply Vcc to GND, so that its size must be even larger in order to increase the potential of the word line rapidly.

Second, to reduce as much as possible a releasing amount of charge stored in the capacitor 33 of the boost circuit 16, the potential of the word line must be set close as much as possible to the output voltage Vcc of the boost circuit before it is activated.

Figure 7:
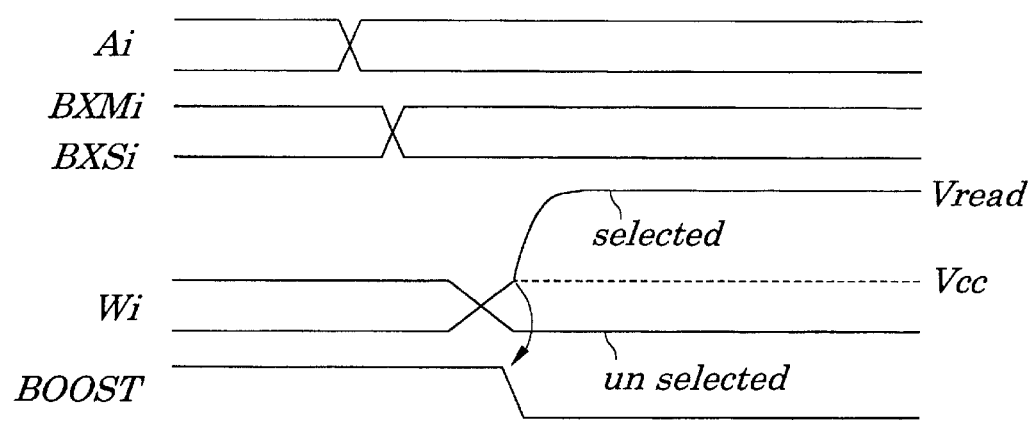
FIG. 7 is a timing chart explaining establishment of a word-line driving potential in the same embodiment.

FIG. 7 illustrates how to establish a potential of a word line in response to switch-over in addressing.

When the external address signal Ai has changed and correspondingly the main decoder select signal BXMi and the low-order pre-decode signal BXSi have changed in state, word lines rendered unselected are connected through the NN-channel type transistors 24 and 25 to the power supply VNEGd, to be reset to the GND level (e.g., 0.0 Vcc) and, at the same time, to output a Vcc level from VPXd to a selected word line.

Just when these unselected word lines have reached the GND level (e.g., 0.1 Vcc) and the selected word line has reached the Vcc level (e.g., 0.9 Vcc), the boost signal boost goes low in level to activate the boost circuit 16, thus outputting a boost voltage level (read-out voltage Vread) to the selected word line.

Figure 16:
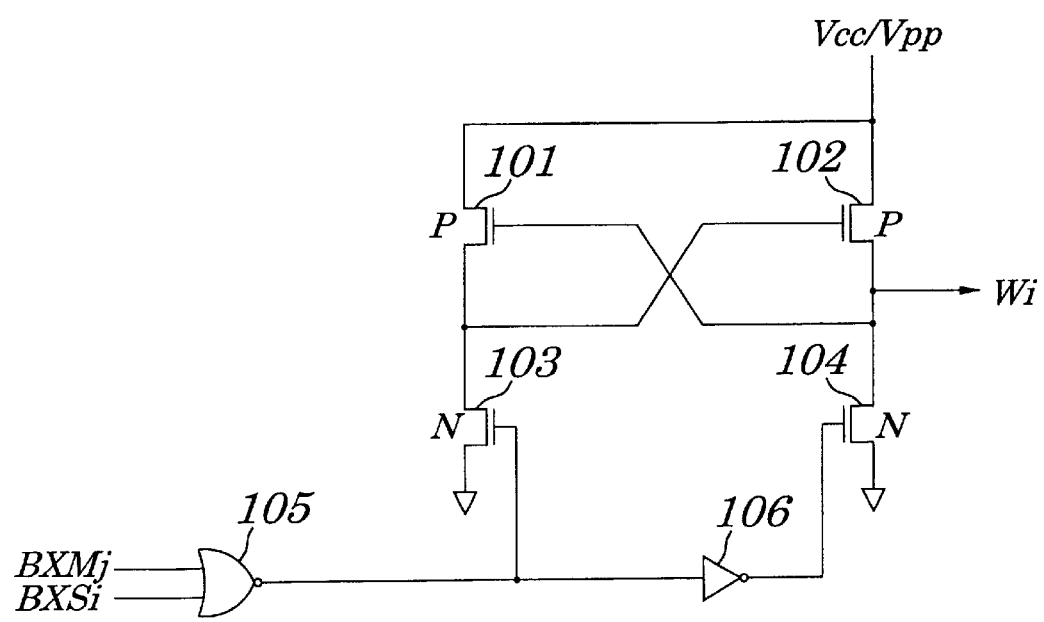
FIG. 16 is an exemplified circuit diagram of a conventional word-line driving circuit.

Thus, the word lines can be driven by the word-line driving circuit shown in FIG. 4. The word-line driving circuit in this embodiment uses its five component transistors of the P-channel transistors 21 and 22, the N-channel type transistor 23, and the NN-channel type transistors 24 and 25, to desired word-line driving operations, thus reducing the number of transistors required as compared to the conventional word-line driving circuit shown in FIG. 16.

Second Embodiment

Detailed description of the second embodiment is omitted here because its overall chip configuration, address-system configuration, and sub-row pre-decoder configuration to which a word-line drive system is applied are almost the same as those of the first embodiment.

Figure 8:
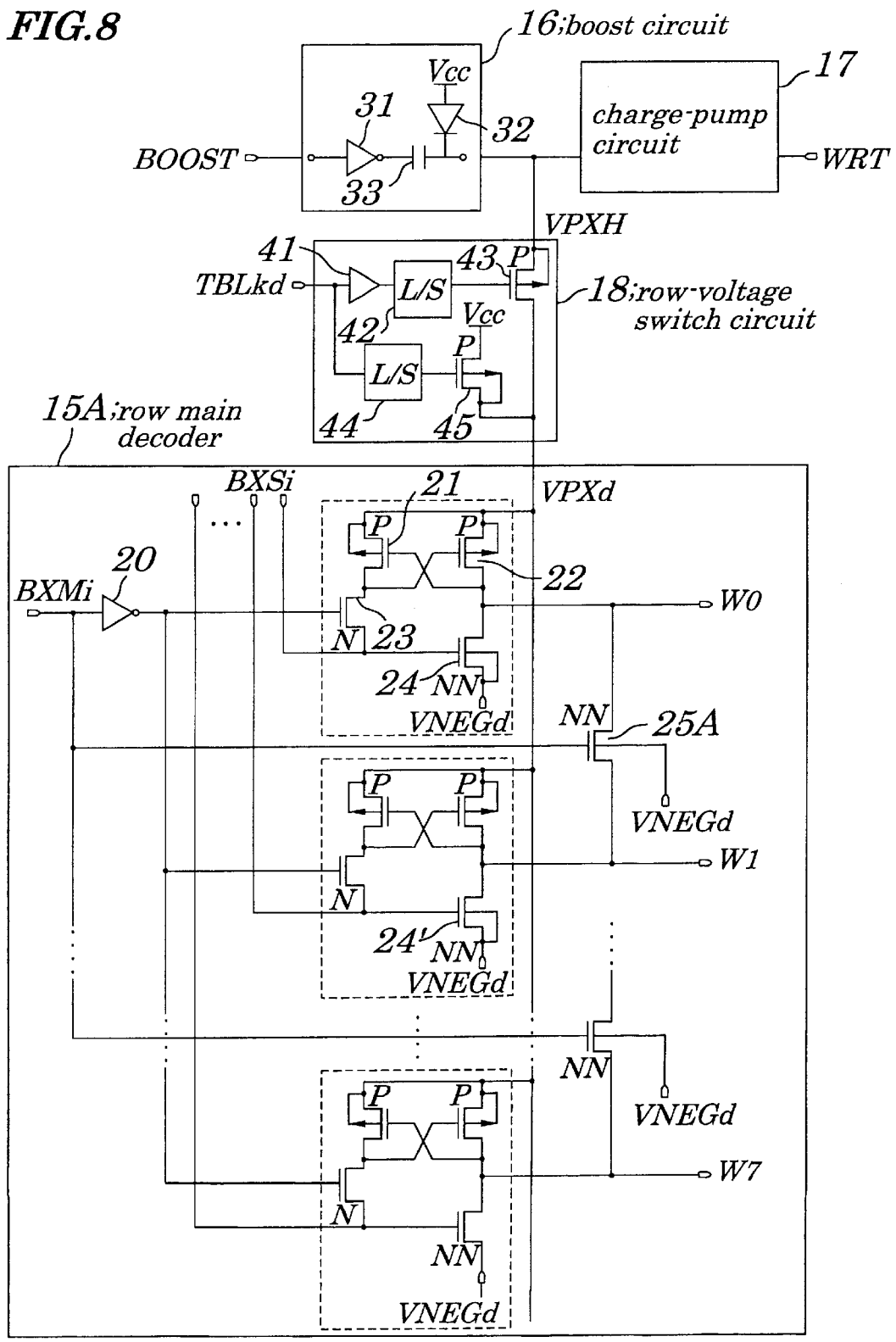
FIG. 8 is a circuit diagram of a configuration of a word-line driving circuit according to a second embodiment of the present invention.

As shown in FIG. 8, the word-line drive system according to this embodiment largely differs from that according to the first embodiment shown in FIG. 4 in a respect that an NN-channel type transistor 25A for resetting a word line corresponding to the main decoder select signal BXMi has its source and drain connected between its adjacent word lines, for example word lines W0 and W1.

The NN-channel type transistor 25A, which is of a triple-well structure, has its back gate connected with the power supply VNEGd. The power supply VNEGd is usually set to the GND potential but, at the time of an erasure operation, set to the erasure voltage Veras (e.g., −10.0V).

When, in a row main decoder 15A for example, the main decoder select signal BXMi is of an un-selecting level (i.e. high level), even if a low-order pre-decode signal BXS0 corresponding to the word line W0 is from a selecting level (i.e., low level), a low-order pre-decode signal BXS1 corresponding to the adjacent word line W1 is of an un-selecting level (i.e., high level) and an NN-channel type transistor 24 connected to the word line W1 is turned ON, so that the word line W0 is reset through the NN-channel type transistor 25A.

At the time of an erasure operation, on the other hand, when the BXS1 signal goes low in level, the NN-channel type transistor 24 is turned ON and, at the same time, the main decoder select signal BXMi goes of a selecting level (i.e., low level), to turn ON the NN-channel type transistor 25A, thus connecting each word line to the power supply VNEGd (Veras) to erase the contents of all the word lines in the relevant block at a time.

FIG. 9A shows a connection diagram for a word-line reset circuit in a row main decoder according to this embodiment, in which reference numerals 25A1, 25A2, 25A3, and 25A4 indicate word-line resetting NN-channel type transistors connected between word-line pairs of W0–W1, W2–W3, . . . , and W6–W7 respectively in the relevant block.

In FIG. 9A, since each word-line resetting NN-channel type transistor is connected between its adjacent word lines, when the main decoder select signal BXMi for that row main decoder 15 of an un-selecting level (i.e., high level), even if that block includes a selected word-line driving circuit (i.e., with BXMi being low in level), that wordline can be reset.

Thus, according to the word-line of this embodiment, the transistor for resetting and erasing the contents of word lines must be arranged only one for every two word lines, to need only 4.5 transistors which constitute the word-line driving circuit, thus further reducing the number of required transistors as compared to the first embodiment.

Third Embodiment

As shown in FIGS. 9B and 9C, a word-line driving circuit according to the third embodiment of the present invention largely differs from the second embodiment shown in FIG. 9A, the first case, in a respect that an NN-channel type transistor for resetting a word line corresponding to the main decoder select signal BXMi when the word line is not selected is connected between word lines not adjacent thereto in such a manner as to form a combination of two independent word lines.

In the second case of FIG. 9B, NN-channel type transistor 25A$_1$', 25A$_2$', 25A$_3$', and 25A$_4$' which constitute a word-line reset circuit are connected between word-line pairs of W3–W4, W2–W5, . . . , and W0–W7 respectively in a row main decoder.

In the third case of FIG. 9C, on the other hand, NN-channel type transistors 25A$_1$", 25A$_2$", 25A$_3$", and 25A$_4$" which constitute a word-line reset circuit are connected between word-line pairs of W0–W2, W1–W3, . . . , and W5–W7 respectively in a row main decoder.

In both second and third cases of FIGS. 9A and 9B, since the word-line resetting NN-channel type transistor is connected between two word-lines not adjacent thereto, even if, like in the case of the second embodiment, the main decoder select signal BXMi is high in level in the relevant block, a word line (with the corresponding BXMi signal being low in level) selected in that block can be reset.

Figure 9:
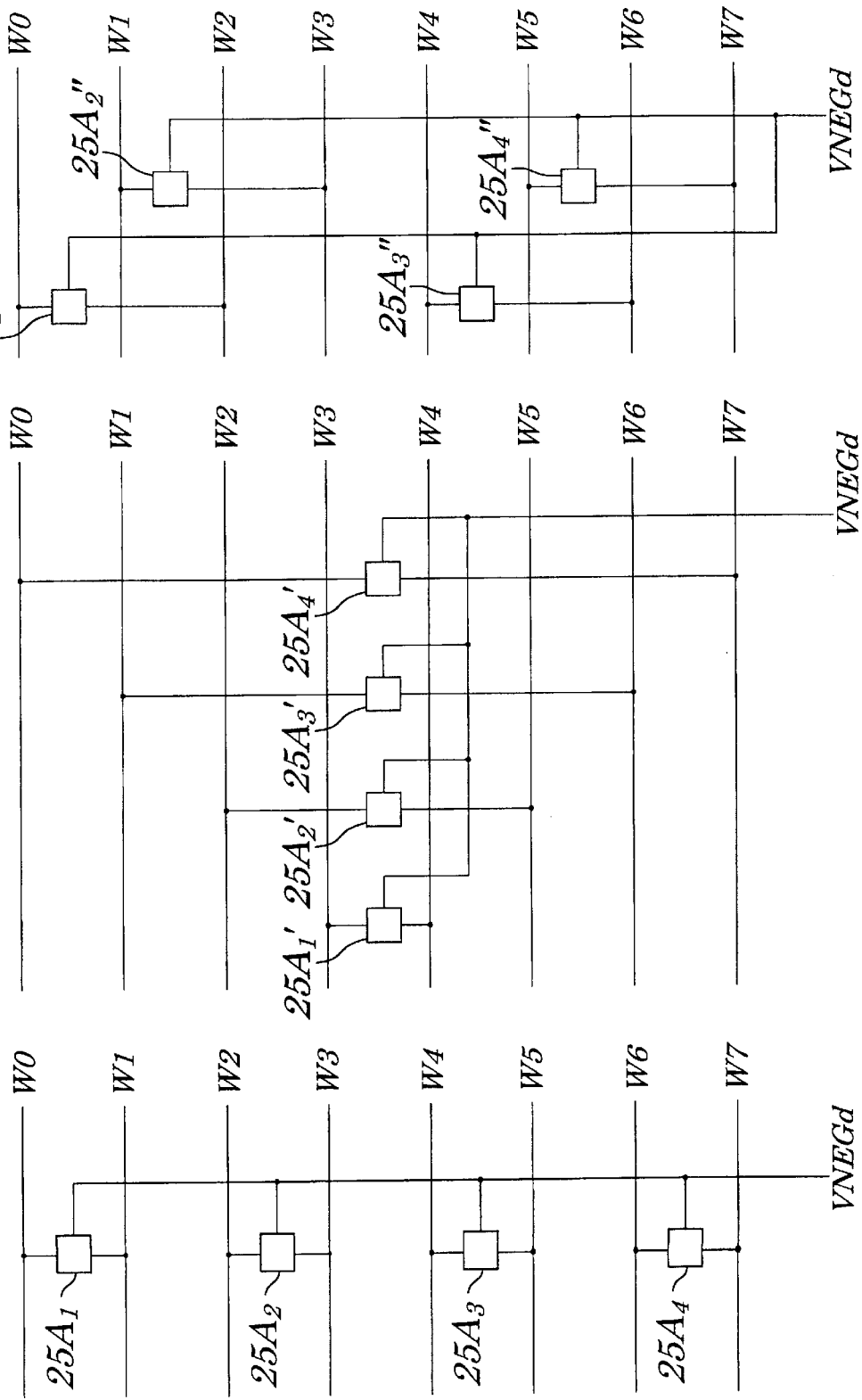
FIG. 9A is an exemplified connection diagram of a word-line resetting circuit according to the same embodiment.
FIGS. 9B and 9C are exemplified connection diagrams of a word-line resetting circuit according to a first embodiment of the present invention.

The resetting NN-channel type transistor for word lines in one block can be arranged in a way other than those exemplified in the second and third cases of FIG. 9.

Thus, according to the word-line driving circuit of this embodiment, like in the case of the second embodiment, it is enough to arrange the transistor for resetting word lines only one for each two word lines, to reduce the number of transistors constituting a word-line driving circuit to 4.5, thus further decreasing the number of required transistors as compared to the first embodiment. Moreover, this embodiment makes it possible to arbitrarily arrange the word-line resetting transistor based on an on-the-chip location of the word-line driving circuit, thus increasing a degree of freedom in designing of semiconductor memory device chip.

Fourth Embodiment

Figure 10:
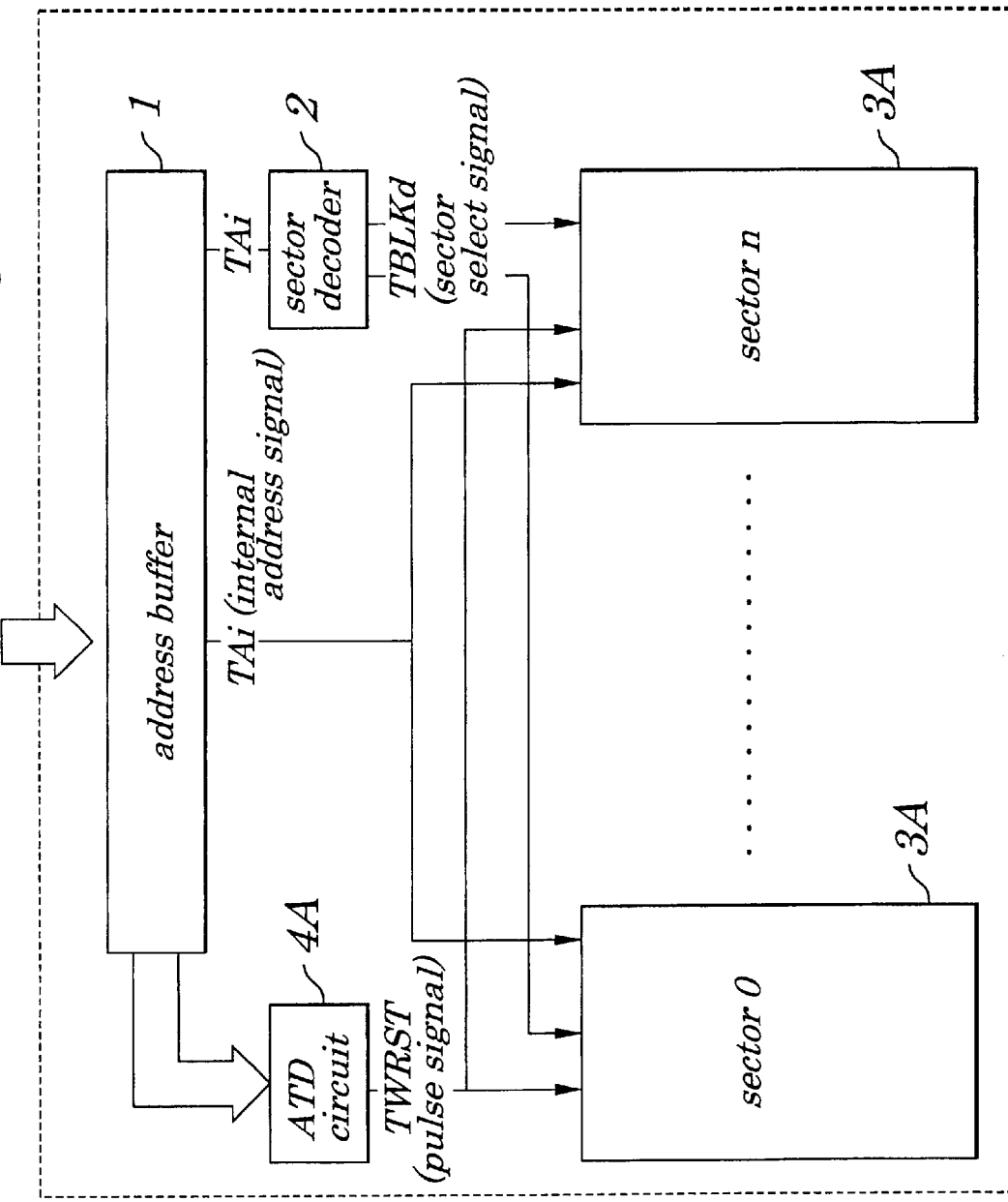
FIG. 10 is a block diagram showing an overall configuration of a semiconductor memory device to which is applied a word-line driving circuit according to a fourth embodiment of the present invention.

As shown in FIG. 10, a semiconductor memory chip device roughly comprises an address buffer 1, a sector decoder 2, a plurality of sectors 3A (sectors 0–n), and an ATD circuit 4A.

The configurations of the address buffer 1 and the sector decoder 2 are the same as those of the first embodiment shown in FIG. 1.

The ATD circuit 4A has functions of the ATD circuit 4 of the first embodiment and, in addition, a function of detecting switch-over of addressing at the address buffer 1 and then outputting the pulse signal TWRST to the sectors 3A (sectors 0–n).

Figure 11:
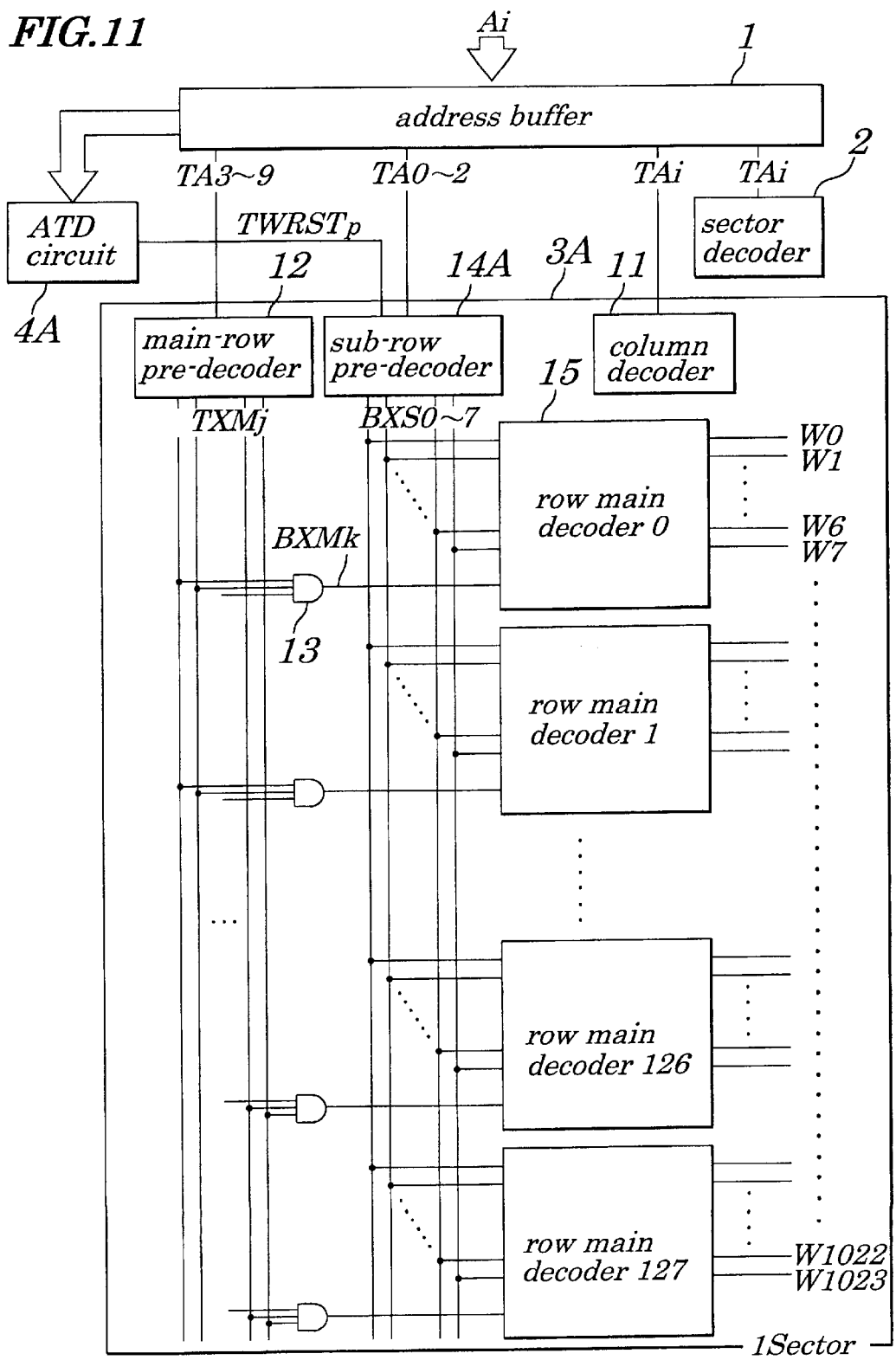
FIG. 11 is a block diagram showing an address-system configuration of a semiconductor memory device to which is applied a word-line driving circuit according to the same embodiment.

Each of the sectors 3A roughly comprises, as shown in FIG. 11, a column decoder 11, a main-row pre-decoder 12, a plurality of AND circuits 13, a sub-row pre-decoder 14A, and a plurality of row main decoders 15 (row main decoders 0–127).

The column decoder 11, the main-row pre-decoder 12, the AND circuits 13, and the row main decoders 15 are the same as those of the first embodiment shown in FIG. 2.

Figure 12:
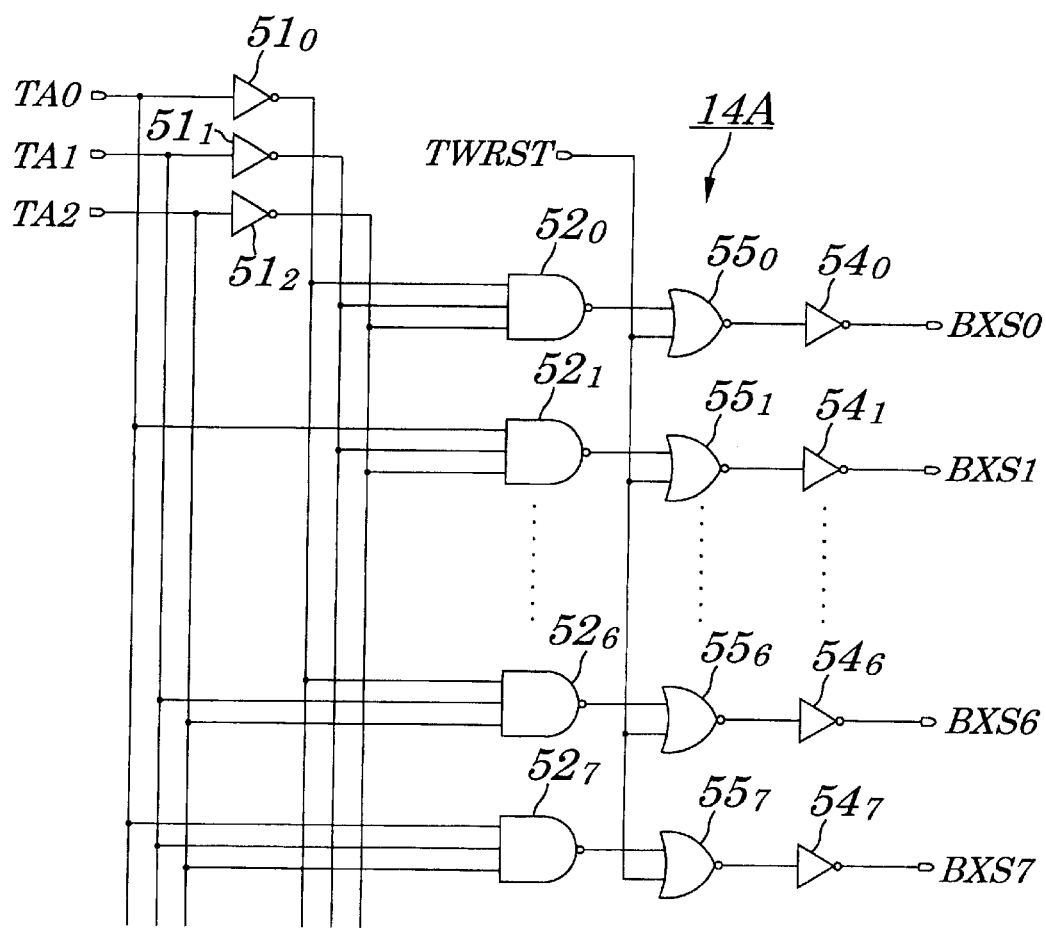
FIG. 12 is a circuit diagram showing a configuration of a sub-row pre-decoder which corresponds to the word-line driving circuit according to the same embodiment.

As shown in FIG. 12, the sub-row pre-decoder 14A comprises inverters $51_0$, $51_1$, and $51_2$, NAND circuits $52_0$, $52_1$, ..., $52_6$, and $52_7$, inverters $54_0$, $54_1$, ..., $54_6$, and $54_7$, and NOR circuits $55_0$, $55_1$, ..., $55_6$, and $55_7$.

The inverters $51_0$, $51_1$, and $51_2$ generate inverted outputs of the levels of the internal address signals TA0, TA1, and TA2 respectively. The NAND circuits $52_0$, $52_1$, ..., $52_6$, and $52_7$ receive combinations of three of a total of six signals of the three internal address signals TA0, TA1, and TA2 and another three signals obtained by inverting them, to provide respective outputs. The NOR circuits $55_0$, $55_1$, ..., $55_6$, and $55_7$ perform NOR logical operations on the output of the NAND circuits $52_0$, $52_1$, ..., $52_6$, and $52_7$ respectively and the pulse signal TWRST signal input from the ATD circuit 4A, to output signals obtained by pulsing output signals of the NAND circuits $52_0$, $52_1$, ..., $52_6$, and $52_7$ respectively. The inverters $54_0$, $54_1$, ..., $54_6$, and $54_7$ invert outputs of the NOR circuits $55_0$, $55_1$, ..., $55_6$, and $55_7$, to output low-order pre-decode signals BXS0, BXS1, ..., BXS6, and BXS7 respectively.

The configuration of a word-line driving circuit to which this embodiment is applied is the same as that shown in FIG. 8.

Figure 13:
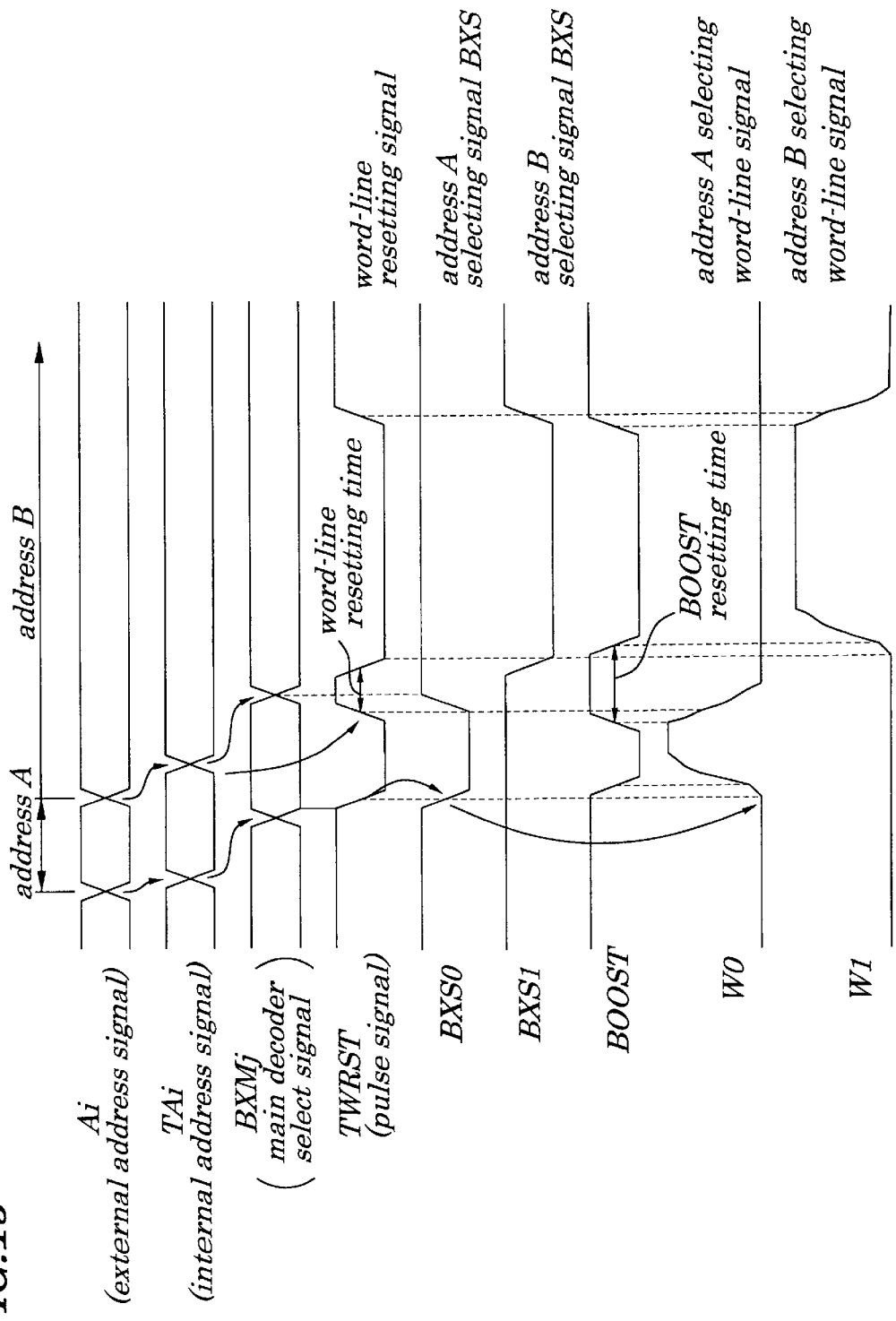
FIG. 13 is a timing chart explaining operations of the word-line driving circuit according to the same embodiment.

The following will describe in detail the read-out operations by a word-line driving circuit according to this embodiment with reference to FIGS. 8 and 13.

When the external address Ai changes in addresses A and B in this order and, correspondingly, the internal address TAi changes to define the main decoder select signal BXMj and sequentially set the low-order pre-decode signals BXS0 and BXS1 to a low level corresponding to the addresses A and B respectively, as shown in FIG. 12, in the sub-row pre-decoder 14A, the output of the NAND circuits $52_0$, $52_1$, ..., and the pulse signal TWRST are NOR-tied to set to a low level by sequentially pulsing the select signal BXS corresponding to the pulse signal TWRST in such a manner that the BXS0 signal may correspond to the address A and the select signal BXS1 may correspond to the address B. If, in this case, there is a sufficiently long interval of switch-over in addressing, the pulse signal TWRST goes low in level somewhat later than the timing at which an unselected word line goes selected and, in a prescribed lapse of time after completion of read-out, returns to a high level. If the switch-over interval is short, on the other hand, as it does when the address signal changes from the address A to B as shown in FIG. 13 for example, the pulse signal TWRST returns to a high level somewhat faster than the timing at which a selected word line goes unselected and goes low in level somewhat later than the timing at which an unselected word line goes selected. The time for which the pulse signal TWRST is held at a high level in this case is equal to a word reset time for which the word line is held in a reset state.

The boost signal BOOST for generating a step-up voltage from the boost circuit 16 is controlled in such a manner as to change to a low level in a predetermined time lapse after the pulse signal TWRST goes low in level and changes to a high level in a predetermined time lapse after the TWRST signal goes high in level. The time for which the boost signal BOOST is held at a high level is equal to the boost-reset time for which the step-up voltage is not output.

The following will describe the operations focusing on a state in which the address changes from address A to B. In a word-line driving circuit corresponding to a word line W0, the power supply VPXd from the boost circuit 16 is already set at a step-up voltage (voltage Vread at the time of read-out) and reset when the word line W0 completes a read-out operation and then goes unselected during a word-line reset time. When the word-line reset time expires, a word line W1 goes selected to set the power supply VPXd to the voltage Vread, thus starting a read-out operation at the word line W1.

When, in this state, the address changes from address A to B with the main decoder select signal BXMi held at a low level and the low-order pre-decode signal BXS0 changes from a low to high level corresponding to the pulse signal TWRST, the power supply VPXd has been held at the Vcc level because the boost signal BOOST, as mentioned above, changed to a high level a predetermined time lapse before the TWRST signal had changed to a high level. Therefore, in the word-line driving circuit corresponding to the word line W0 which changes from a selected state to an unselected state, there is no problem of a through current flowing from the power supply VPXd already held at the step-up voltage through the P-channel type transistor 22 and the NN-channel type transistor 24 to GND.

Next, when the low-order pre-decode signal BXS1 changes from a high to low level, the boost signal BOOST is at a high level, so that the power supply VPXd remains at the Vcc level. Therefore, in the word-line driving circuit corresponding to the word line W1 which changes from an unselected state to a selected state, there is no problem of a through current flowing from the power supply VPXd through the P-channel type transistor 22 and the N-channel type transistor 24 to GND.

Figure 14:
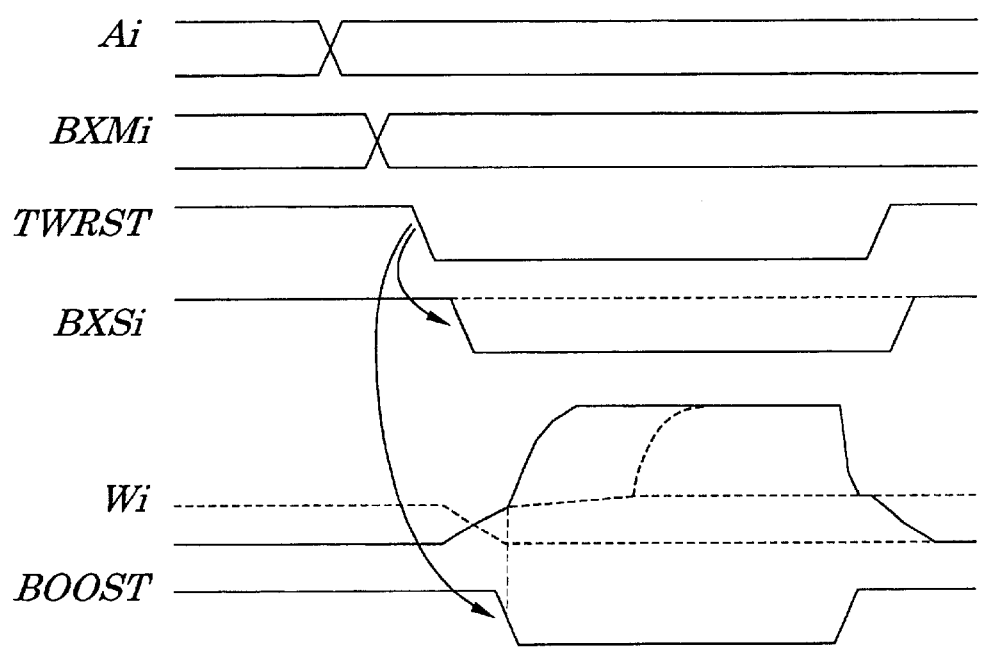
FIG. 14 is a timing chart explaining establishment of a word-line driving potential in the same embodiment.

FIG. 14 explains establishment of a word-line driving potential at the time of switch-over in addressing.

When the external address signal Ai changes, the main decoder select signal BXMi is switched correspondingly and also correspondingly the pulse signal TWRST goes low in level and further correspondingly the low-order pre-decode signal BXSi goes low in level to connect the word line W1 to the power supply VPXd set at the Vcc level and subsequently set the boost signal BOOST to a low level, thus setting the power supply VPXd connected to the word line W1 to a step-up voltage (Vread).

With this, as mentioned above, the boost signal BOOST applied to the boost circuit 16 is controlled so as to be changed to a low level a predetermined time lapse after the pulse signal TWRST went low in level. In this case, if the P-channel type transistor is small in size, even when the predetermined lapse of time elapses after the pulse signal TWRST went low in level, the driving voltage does not sufficiently rise (only to, for example, 0.9 Vcc) because of a large load capacitance of a selected word line, but the low-order pre-decode signal BXSi is already at a low level and so the NN-channel type transistor 24 is already turned OFF completely, to prevent a through current flowing from the power supply VPXd via the P-channel type transistor 22 and the NN-channel type transistor 24, so that the boost circuit can be activated. When the boost circuit is thus activated, the power supply VPXd rises rapidly, thus preventing a word-line selecting speed from decreasing even with the small size of the P-channel type transistor 22.

In this embodiment, the selected word line W1 activates the boost circuit 16 before the driving voltage rises sufficiently (to, for example, 0.9 Vcc), to increase are leasing amount of charge stored in the capacitor 33 of the boost circuit 16; however, the capacitor 33 is originally designed to have a significantly large capacitance, so that a decrease in the step-up voltage (Vread) does not constitute a practical problem as far as no through current flows to GND.

In this embodiment, since the low-order pre-decode signal is pulsed to thus reset the potential of selected word lines at the word-line resetting time, in a word-line driving circuit corresponding to a word line which changes from an unselected state to a selected state, in a predetermined time lapse after the pulse signal TWRST went low in level, the boost signal BOOST goes low in level, to thus increase the power supply VPXd, so that there is no need to increase the power supply VPXd only after the word line is securely set to the Vcc level in contrast to a case where the low-order pre-decode signal is not pulsed (shown by a dotted line in FIG. 14), thus increasing the speed of accelerating the word line.

There is no need either to wait until the word line is securely set to the Vcc level, so that the P-channel type transistor 22 for supplying a current to word lines can be reduced in size.

Figure 15A:
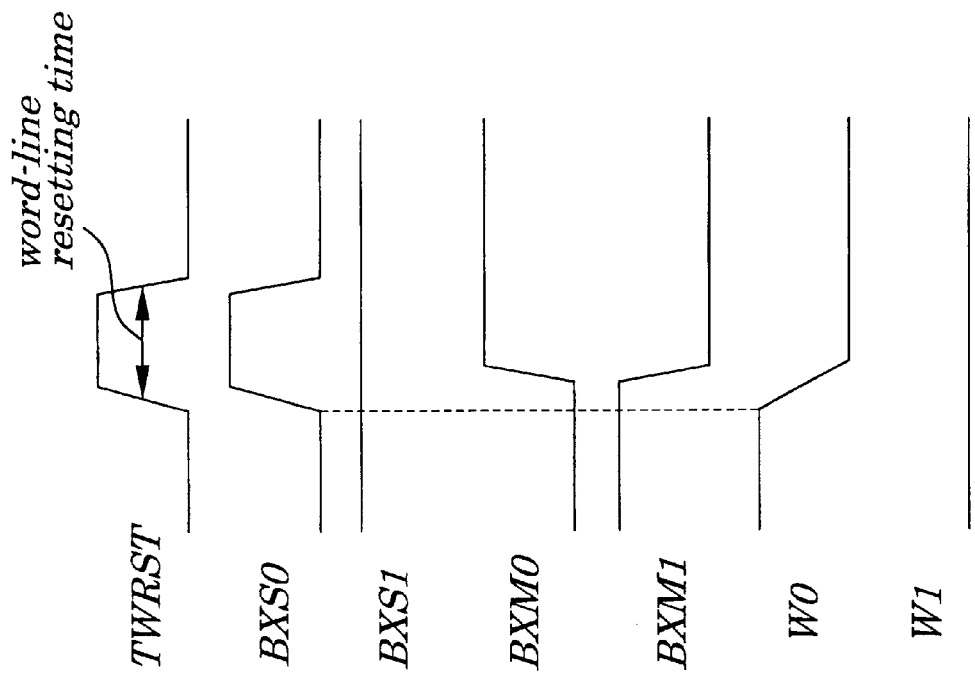
FIGS. 15A and 15B are timing charts for explaining operations of switching blocks in the same embodiment.

FIG. 15A explains operations of switching blocks in this embodiment, with first case showing where the low-order pre-decode signal is not pulsed. In the case where the low-order pre-decode signal BXS0 is at a low level and the low-order pre-decode signal BXS1 is at a high level in a block, if the main decoder select signal BXMO corresponding to a high-order address signal of BXS0 and BXS1 changes from low to high in level and the main decoder select signal BXM1 changes from high to low in level, correspondingly the word line W0 which has been in a selected state goes unselected but the word line W1 which has been in an unselected state remains unchanged.

When the BXMO signal changes from low to high in level and, as shown in FIG. 8, the resetting NN-channel type transistor 25A is connected between the word lines W0 and W1, the NN-channel type transistor 25A turned ON and the NN-channel type transistor 24' which corresponds to the word line W1 and which has originally been in an ON-state cooperate with each other to try to reset the word line W0 to GND. To change the state of the P-channel type transistor 22 corresponding to the word line W0 from an ON-state to an OFF-state rapidly, the potential of the word line W0 must be decreased to change the P-channel type transistor 21 corresponding to the word line W0 from an OFF-state to an ON-state and set the potential of the drain of the P-channel type transistor to a high level, thus setting the gate of the P-channel type transistor 22 to a high level.

To decrease the potential of the word line W0 rapidly, a current supply capacity of a two-stage stack transistor to which the NN-channel type transistor 25A and the NN-channel type transistor 24' are stacked must be larger than that of the P-channel type transistor 22. That is, it is necessary to increase the sizes of both the NN-channel type transistor 25A and the NN-channel type transistor 24.

Figure 15B:
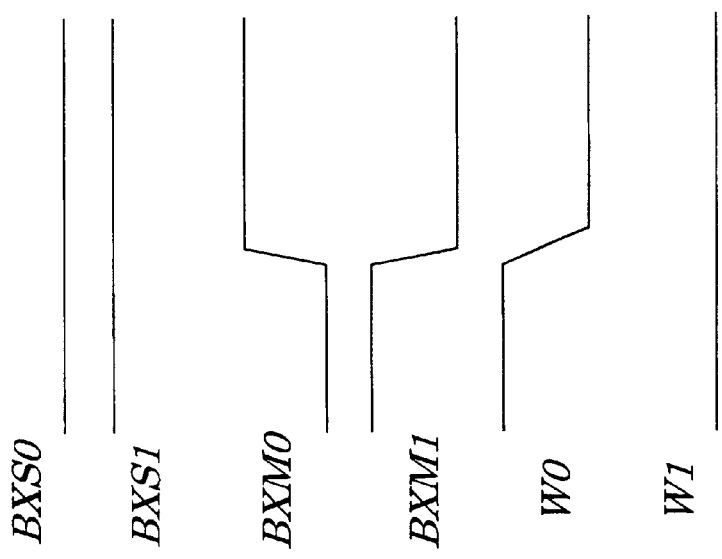

FIG. 15B, a second case, on the other hand, shows a case where the low-order pre-decode signal is pulsed. In this case, the low-order pre-decode signal BXS0 goes high in level corresponding to the pulse signal TWRST, during which the P-channel type transistor 22 is turned OFF and the NN-channel type transistor 24 is turned ON in a word-line driving circuit corresponding to the word line W0, thus trying to reset the word line W0 to GND. Therefore, the NN-channel type transistor 25A may be of a minimum required size. As for the NN-channel type transistor 24 also, it always resets the word line to GND with only one stage, thus requiring only a half the size of the case where that signal is not pulsed so that it may be reset with two stages stacked.

Thus, in such a configuration that the word-line resetting NN-channel type transistor is shared in use by two word lines in a block, even when the main decoder select signal BXMi is switched with word lines in a block held in a selected state, by pulsing the low-order pre-decode signal, the NN-channel type transistor 24 can be turned ON and the P-channel type transistor 22 can be turned OFF before the main decoder select signal is thus switched, to always reset the word lines to GND, thus reducing the size of the NN-channel type transistors 25A and 24.

Thus, according to the word-line driving circuit according to this embodiment, by arranging one transistor for resetting and erasing the stored information of word lines for every two of the word lines, the number of transistors constituting each word-line driving circuit can be reduced and, also by pulsing the low-order pre-decode signal, the P-channel type transistors 22 and the NN-channel type transistor 25A can be reduced in size without decreasing the word-line driving speed.

It is apparent that the present invention is not limited to the above embodiments but may be changed and modified without departing from the scope and spirit of the invention.

For example, the boost circuit 16 and the row power-supply switch circuit 18 may be of a configuration other than those of the above-mentioned embodiments. The charge-pump circuit 17 may be of an arbitrary configuration.

The semiconductor memory device to which a word-line driving circuit of the present invention is applied is not limited to a flash memory but includes a Programmable Read Only memory (PROM), Erasable Programmable Read Only Memory 8EPROM), or a mask Read Only Memory (EPROM).

Also, the configuration of the word-line driving circuit according to the present invention is not limited to that of a semiconductor memory device but is applicable to any other types of semiconductor ICs in which unitary elements connected to a word line are driven according to the high-order and the low-order address signals.

Finally, the present application claims the priority of Japanese Patent Application No. Hei11-054773 filed on Mar. 2, 1999, which is herein incorporated by reference.

What is claimed is:

1. A word-line driving circuit provided for each corresponding word line for selecting said predetermined word line with a low-order address signal from among a plurality of word lines divided into a plurality of blocks one of which is selected by a high-order address signal, said word-line driving circuit comprising:

a first P-channel type transistor connected between a first power supply for supplying a predetermined potential to selected word lines and a word line;

a second P-channel type transistor connected with said first P-channel type transistor in a flip-flop configuration;

a first N-channel type transistor which is connected between a first signal line for supplying a signal obtained by decoding a low-order address and a gate of said first P-channel type transistor and a gate of which is connected with a second signal line for supplying a signal obtained by decoding a high-order address;

a second N-channel type transistor which is connected between a second power supply for securing a potential of an unselected word line and said word line and a gate of which is connected with said first signal line; and a third N-channel type transistor which is connected between said word line and said second power supply and a gate of which is connected with said second signal line.

2. The word-line driving circuit according to claim 1, wherein said second power supply supplies a word line with a negative potential at a time of an erasure operation.

3. The word-line driving circuit according to claim 2, wherein said second N-channel type transistor and said third N-channel type transistor both of which are connected to said second power supply are designed so as to be operative even when supplied with a negative potential.

4. The word-line driving circuit according to claim 1, wherein said third N-channel type transistor is shared in use by two word-line driving circuits adjacent each other in said block and connected between word lines in said two word-line driving circuits and also a back gate of said third N-channel type transistor is connected with said second power supply.

5. The word-line driving circuit according to claim 1, wherein said third N-channel type transistor is shared in use by two word-line driving circuit not adjacent to each other in said block and connected between said two word-line driving circuits and a back gate of said third N-channel type transistor is connected with said second power supply.

6. The word-line driving circuit according to claim 1, wherein:

when switching said word line from an unselected state to a selected state, said first power supply supplies a current to said word line in such a manner as to increase a potential of said word line up to a power-supply voltage, in response to switch-over of a signal obtained by decoding said low-order address signal; and said first power supply is configured to supply a current to said word line in such a manner as to increase a potential of said word line to a step-up voltage higher than said power-supply voltage by a predetermined lapse of time elapses after completion of switch-over of said signal obtained by decoding said low-order address signal.

7. The word-line driving circuit according to claim 6, wherein said predetermined lapse of time is a time lapse taken by said word line to reach a predetermined voltage after switch-over of said signal obtained by decoding said low-order address signal.

8. The word-line driving circuit according to claim 7, wherein said predetermined voltage is 0.9 Vcc, where Vcc is a power-supply voltage.

9. The word-line driving circuit according to claim 6, wherein said signal obtained by decoding said low-order address signal has been pulsed in response to a pulse signal which detected switch-over in an address signal for selecting a word line.

10. The word-line driving circuit according to claim 9, wherein said pulse signal is terminated in a predetermined lapse of time after detection of switch-over in an address signal for selecting a word line and, in a predetermined lapse of time after starting of said pulse signal, said first power supply supplies a step-up voltage higher than a power-supply voltage.

11. A semiconductor memory device having a plurality of word-line driving circuits according to claim 1, said semiconductor memory device comprising:

a decoder for driving a word line connected to each memory cell in each of a plurality of blocks, said memory cell being capable of electrical write-in and erasure and arranged in an array divided into said plurality of blocks, wherein said decoder is constituted by said plurality of word-line driving circuits;

means for selecting said decoder by use of a select signal corresponding to a high-order address of a word line;

means for selecting one of a plurality of word-line driving circuits in said selected decoder, by use of a plurality of low-order pre-decode signals corresponding to a low-order of a word line in said selected decoder; and means for driving a word line connected to said selected word-line driving circuit.

12. A word-line driving circuit comprising:

means for holding and outputting a first input;

means for initializing a word line from a first state when a first pre-decode input is in an unselected state;

means for initializing a word line from a first state when a second pre-decode input is in an unselected state; and means for putting a word line into a first state by causing said means for holding and outputting a first input to output said first input to said word line, when said first pre-decode input and said second pre-decode input are both in a selected state.

* * * * *